(12) United States Patent
Kim et al.

(10) Patent No.: US 7,543,199 B2  
(45) Date of Patent: Jun. 2, 2009

(54) TEST DEVICE

(75) Inventors: Jae-Il Kim, Kyoungki-do (KR); Jae-Hyuk Im, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 348 days.

(21) Appl. No.: 11/478,076

(22) Filed: Jun. 30, 2006

(65) Prior Publication Data

US 2007/0085559 A1 Apr. 19, 2007

(30) Foreign Application Priority Data

Sep. 29, 2005 (KR) .................. 10-2005-0090941  
Dec. 15, 2005 (KR) .................. 10-2005-0123981

(51) Int. Cl. *G11C 29/00* (2006.01)

(52) U.S. Cl. .................. 714/721; 714/14; 714/22; 714/25; 714/724; 714/718; 714/743; 714/799; 702/57; 702/58; 702/59; 702/60; 702/63; 702/64; 713/340

(58) Field of Classification Search ............... None  
See application file for complete search history.

(56) References Cited

U.S. PATENT DOCUMENTS

| | | | |
|---|---|---|---|
| 6,256,754 B1 * | 7/2001 | Roohparvar | ............ 714/718 |
| 6,298,001 B1 * | 10/2001 | Lee et al. | ............ 365/226 |
| 6,313,655 B1 | 11/2001 | Krause | |
| 6,337,819 B1 * | 1/2002 | Shinozaki | ............ 365/201 |
| 6,486,731 B2 * | 11/2002 | Yamasaki et al. | ............ 327/541 |
| 6,504,393 B1 | 1/2003 | Lo et al. | |
| 6,801,048 B2 | 10/2004 | Farnworth et al. | |
| 7,237,156 B1 * | 6/2007 | Srinivasan et al. | ............ 714/719 |
| 2001/0005143 A1 * | 6/2001 | Beer et al. | ............ 324/765 |
| 2004/0257106 A1 | 12/2004 | Kang et al. | |

FOREIGN PATENT DOCUMENTS

| | | |
|---|---|---|
| JP | 6-84291 | 3/1994 |
| JP | 9-219099 | 8/1997 |
| JP | 2001-242226 | 9/2001 |
| JP | 2004-178672 | 6/2004 |
| JP | 2004-310918 | 11/2004 |
| KR | 1992-0006830 | 4/1992 |
| KR | 10-2001-0004112 A | 1/2001 |
| TW | 1227787 | 2/2005 |
| TW | 200508631 | 3/2005 |

OTHER PUBLICATIONS

English translation of Taiwanese Office Action issued in Taiwanese Patent Application No. TW 095124094, mailed May 29, 2008.

* cited by examiner

*Primary Examiner*—John P Trimmings  
(74) *Attorney, Agent, or Firm*—Mannava & Kang P.C.

(57) ABSTRACT

A test device that can improve test reliability is provided. In the test device, an error detecting unit detects an error of inputted test signals to generate an error flag, a normal test unit performs a test operation according to the test signals when the error flag is deactivated, and an error information providing unit indicates the error of the test signals when the error flag is activated.

20 Claims, 5 Drawing Sheets

TEST DEVICE

FIELD OF THE INVENTION

The present invention relates to a semiconductor memory device; and, more particularly, to a test device that can improve test reliability.

DESCRIPTION OF RELATED ART

As the capacity and performance of semiconductor memory devices are increasing, many attempts have been made to test the performance of memory chips more accurately in shorter time.

To achieve this object, a test mode has been proposed. When the device enters the test mode, test control signals are generated using data applied through addresses. Then, a test is performed using the test control signals. Signals generated by an address decoding are classified into signals for a concurrent test mode and signals for a non-concurrent test mode. An operation of the conventional semiconductor memory device in the non-concurrent test mode and the concurrent test mode will be described below with reference to FIGS. 1A to 1D.

FIG. 1A illustrates an operation of the semiconductor memory device in the concurrent test mode.

Referring to FIG. 1A, in the concurrent test mode, a plurality of tests can be concurrently performed. That is, when entering the concurrent test mode, other tests can be newly performed while a certain test is running. When exiting from the test mode, all the running tests are terminated.

FIG. 1B illustrates an operation of the semiconductor memory device in the non-concurrent test mode.

Referring to FIG. 1B, in the non-concurrent test mode, only one test is performed. That is, when entering the non-concurrent test mode, a new test cannot be performed while a certain test is running.

As illustrated in FIGS. 1A and 1B, a plurality of tests can be performed in the concurrent test mode, while only one test can be performed at one time point of the non-concurrent test mode.

FIG. 1C illustrates an operation of the semiconductor memory device when entering from the non-concurrent mode to the concurrent test mode.

Referring to FIG. 1C, the non-concurrent test mode has to be first terminated before the concurrent test mode is executed.

On the contrary, referring to FIG. 1D, the test can be concurrently performed when the non-concurrent test mode is executed in the concurrent test mode.

FIG. 2 is a circuit diagram of a conventional test device.

Referring to FIG. 2, the conventional test device includes a plurality of selectors 10 for outputting an internal voltage through an output pad PAD_CR in response to a plurality of test signals, a test exit detector 20 for detecting an exit of a test mode, and a default selector 30 for outputting a core voltage VCORE as a default through the output pad PAD_CR in response to an output signal of the test exit detector 20.

All test signals TM_VPPEXT, TM_VCPEXT, TM_VDLLEXT and TM_VPERIEXT are signals generated by combining addresses applied after the entrance of the test mode. The test signal TM_VPPEXTB is an inversion signal of the test signal TM_VPPEXT, the test signal TM_VDLLEXTB is an inversion signal of the test signal TM_VDLLEXT, and the test signal TM_VPERIEXTB is an inversion signal of the test signal TM_VPERIEXT.

Upon the operation of the conventional semiconductor memory device, when the test signal TM_VPPEXTB is activated to a logic low level, the selector 10 outputs an internal voltage VPP through the output pad PAD_CR. At this point, the test signal TM_VPPEXT has a logic high level. Thus, the test exit detector 20 deactivates the output signal to a logic high level in response to the logic high level of the test signal TM_VPPEXT. Since the default selector 30 is deactivated by the output signal of the test exit detector 20, the core voltage VCORE is not output through the output pad PAD_CR.

Likewise, an internal voltage VCP is outputted through the output pad PAD_CR when the test signal TM_VCPEXT is activated to a logic high level, an internal voltage VDLL is output through the output pad PAD_CR when the test signal TM_VDLLEXTB is activated to a logic low level, and an internal voltage VPERI is output through the output pad PAD_CR when the test signal TM_VPERIEXTB is activated to a logic low level.

Also, when all the test signals TM_VPPEXT, TM_VPERIEXT, TM_VDLLEXT and TM_VCPEXT are deactivated to a logic low level, the test exit detector 20 activates its own output signal to a logic low level in response to the test signals. Therefore, the default selector 30 outputs the core voltage VCORE as a default through the output pad PAD_CR in response to the output signal of the test exit detector 20. At this point, since the selector 10 is turned off in response to the deactivation of the test signals TM_VPPEXT, TM_VPERIEXT, TM_VDLLEXT and TM_VCPEXT, the internal voltages VPP, VCP, VDLL and VPERI are not output through the output pad PAD_CR.

In such a conventional test device, the internal voltages are selected according to the plurality of test signals in the test mode for measuring the internal voltage. Therefore, various kinds of internal voltages are measured through the single output pad. Consequently, the limitation in the channels of the external test device for testing the semiconductor memory device can be relieved.

If the test mode for measuring the internal voltages is the concurrent test mode, the test for measuring the internal voltages can be performed together with another test. Because the test mode for measuring the internal voltages is the concurrent test mode, the test signals TM_PPEXT, TM_VPERIEXT, TM_VDLLEXT and TM_VCPEXT may be mistakenly simultaneously input.

Accordingly, when two or more test signals are simultaneously activated in the test device, a plurality of internal voltages are connected to a single output pad, causing serious errors. For example, when the test signals TM_VPPEXT and TM_VCPEXT are simultaneously activated to a logic high level, the internal voltages VPP and VCP are shorted and thus an accurate output voltage is not output through the output pad. Consequently, normal memory chips may be recognized as defective.

SUMMARY OF THE INVENTION

It is, therefore, an object of the present invention to provide a test device that can improve test reliability.

In accordance with an aspect of the present invention, there is provided a test device including: an error detecting unit for detecting an error of input test signals and generating an error flag; a normal test unit for performing a test operation according to the test signals when the error flag is deactivated; and an error information providing unit for indicating the error of the test signals when the error flag is activated.

In accordance with another aspect of the present invention, there is provided a test device including: an error detecting unit for detecting an error of input test signals and generating an error flag; a normal test unit for outputting a corresponding one of internal voltages through an output pad in response to the test signals when the error flag is deactivated; and an error information providing unit for indicating that the error occurs in the test signals when the error flag is activated.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A test device in accordance with exemplary embodiments of the present invention will be described in detail with reference to the accompanying drawings.

Figure 1A:
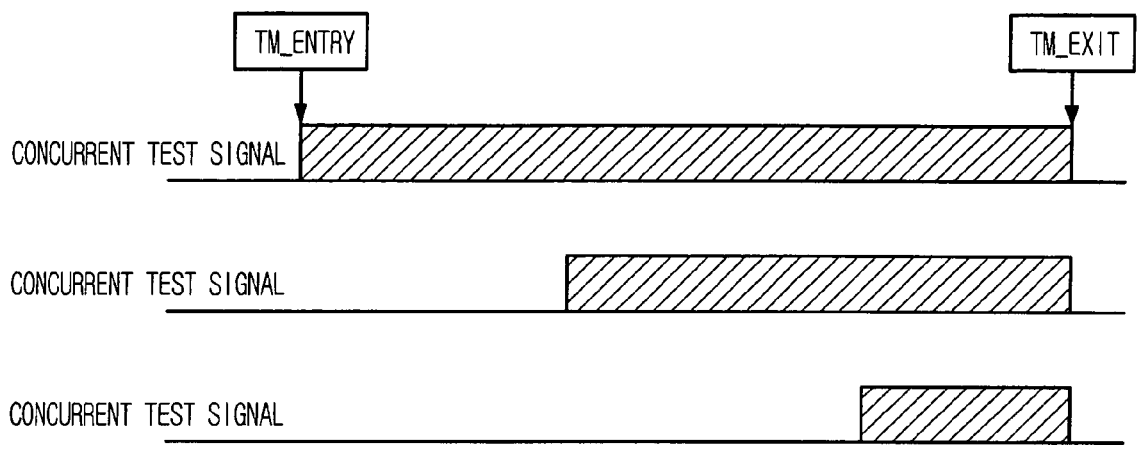
FIGS. 1A to 1D illustrate an operation of a conventional semiconductor memory device in a non-concurrent test mode and a concurrent test mode.
Figure 1B:
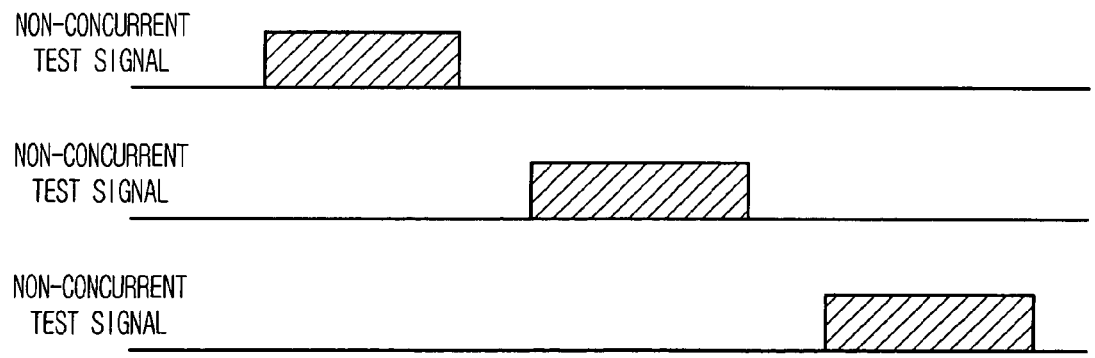
Figure 1C:
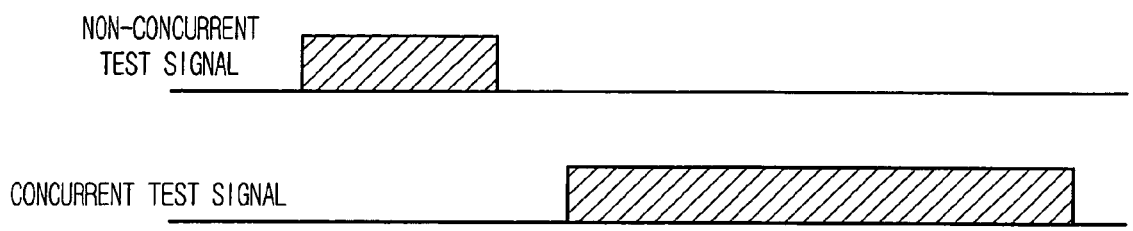
Figure 1D:
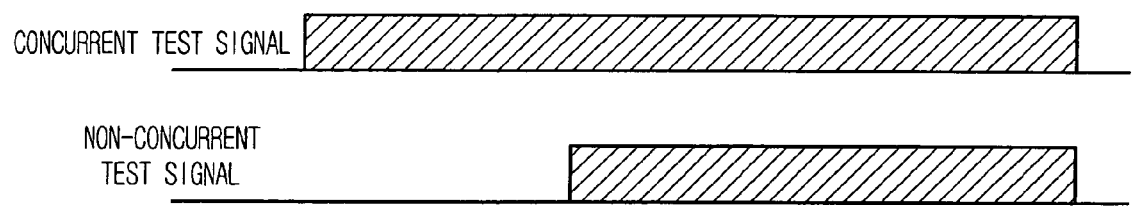
Figure 2:
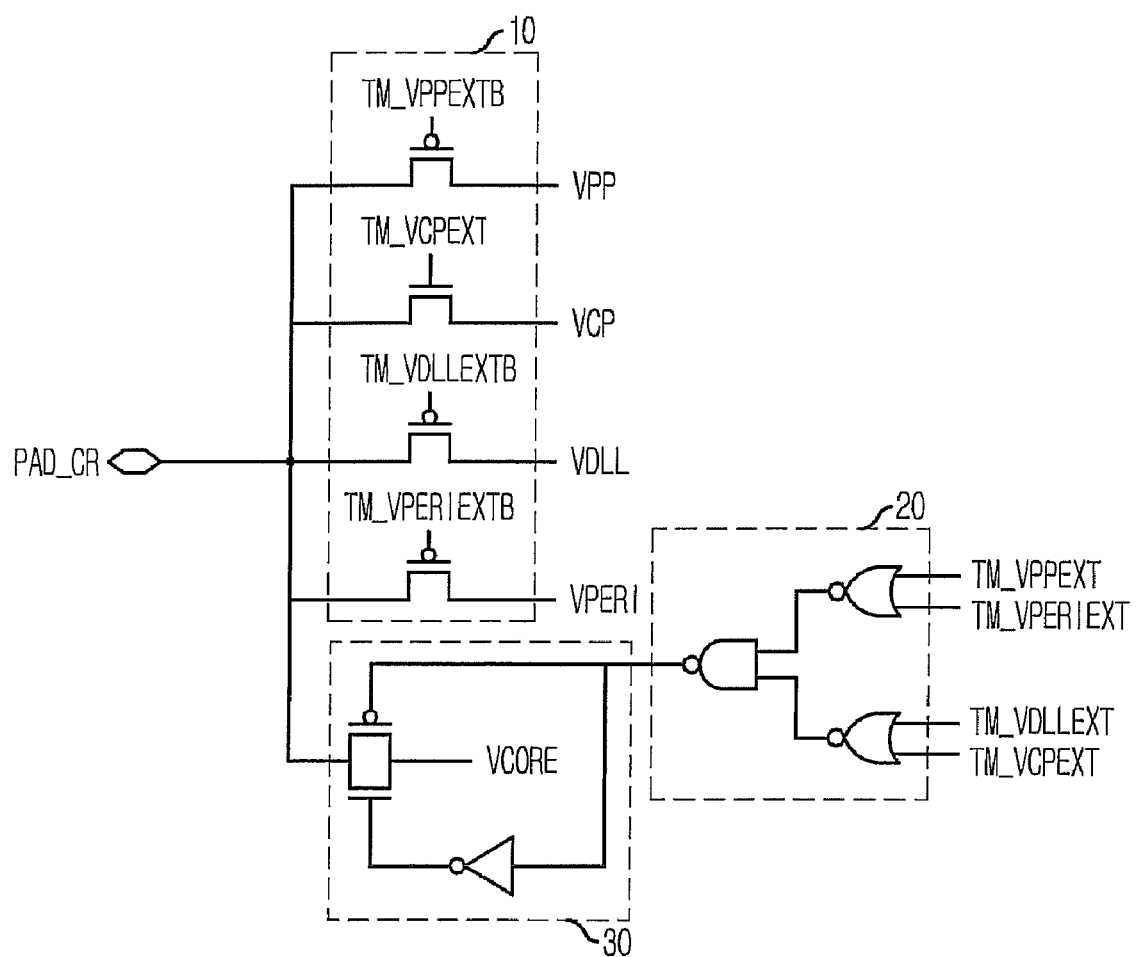
FIG. 2 is a circuit diagram of a conventional test device.
Figure 3:
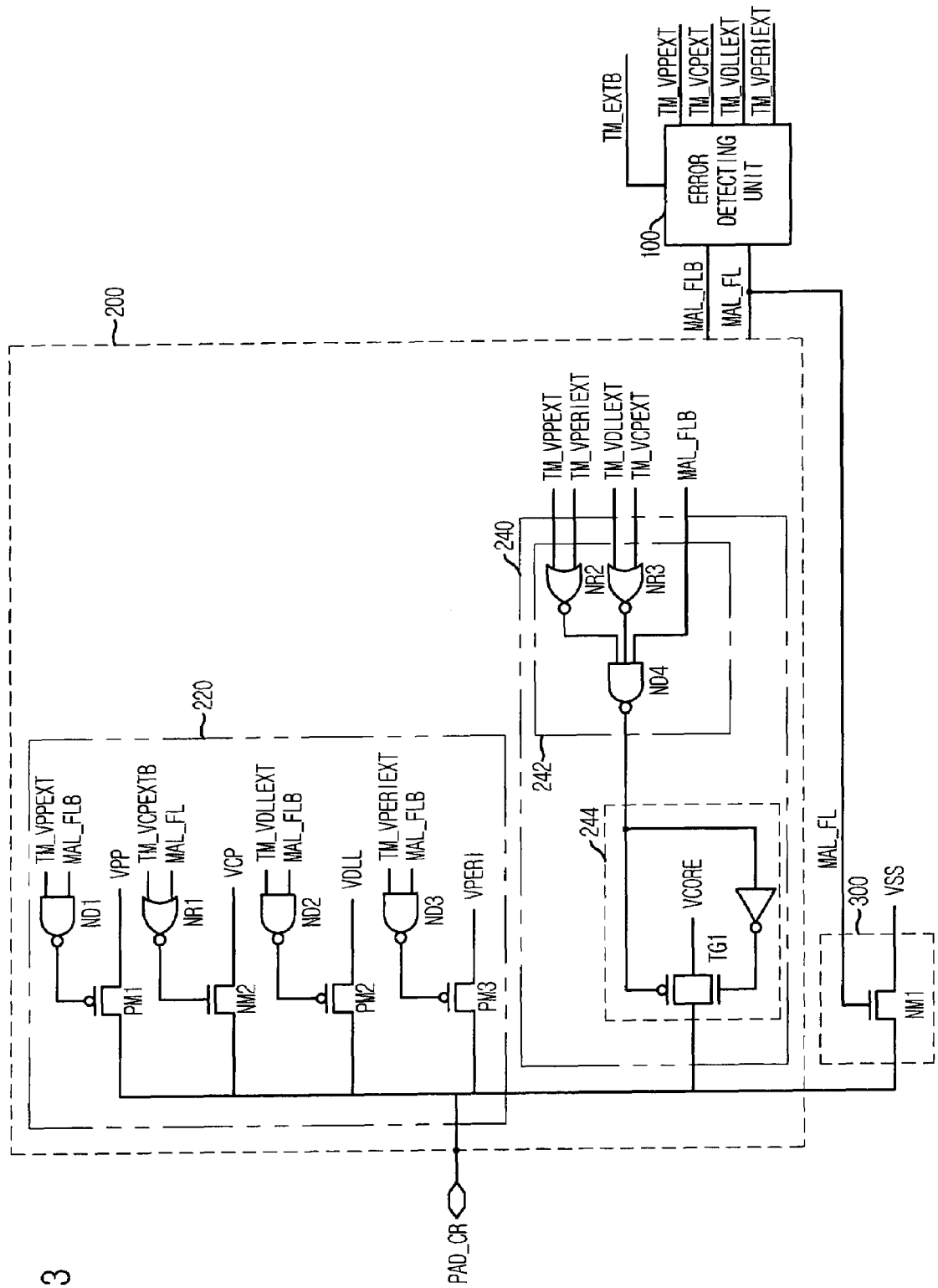
FIG. 3 is a block diagram of a test device in accordance with an embodiment of the present invention.

FIG. 3 is a block diagram of a test device in accordance with an embodiment of the present invention.

Referring to FIG. 3, the test device includes an error detecting unit 100, a normal test unit 200, and an error information providing unit 300. The error detecting unit 100 detects error of test signals TM_VPPEXT, TM_VCPEXT, TM_VDLLEXT and TM_VPERIEXT to generate error flags MAL_FL and MAL_FLB. The normal test unit 200 performs a test in response to the test signals TM_VPPEXT, TM_VCPEXT, TM_VDLLEXT and TM_VPERIEXT applied when the error flags MAL_FL and MAL_FLB are deactivated. The error information providing unit 300 indicates the error of the test signals TM_VPPEXT, TM_VCPEXT, TM_VDLLEXT and TM_VPERIEXT applied when the error flags MAL_FL and MAL_FLB are activated.

When the error flags MAL_FL and MAL_FLB are deactivated, the normal test unit 200 outputs a corresponding one of internal voltages VPP, VCP, VDLL and VPERI through an output pad PAD_CR in response to the corresponding test signals TM_VPPEXT, TM_VCPEXT, TM_VDLLEXT and TM_VPERIEXT.

The normal test unit 200 includes a selector 220 and a default selector 240. The selector 220 outputs the internal voltages VPP, VCP, VDLL and VPERI in response to the test signals TM_VPPEXT, TM_VCPEXT, TM_VDLLEXT and TM_VPERIEXT when the error flags MAL_FL and MAL_FLB are deactivated. The default selector 240 detects the deactivation of all the test signals TM_VPPEXT, TM_VCPEXT, TM_VDLLEXT and TM_VPERIEXT to output the core voltage VCORE as a default through the output pad PAD_CR when the error flags MAL_FL and MAL_FLB are deactivated.

When the error flags MAL_FL and MAL_FLB are activated, the error information providing unit 300 outputs a ground voltage VSS through the output pad PAD_CR, allowing the external test device to know that the error due to the test signals TM_VPPEXT, TM_VCPEXT, TM_VDLLEXT and TM_VPERIEXT occurs within the semiconductor memory device.

The error detecting unit 100 activates the error flags MAL_FL and MAL_FLB when two or more of the test signals TM_VPPEXT, TM_VCPEXT, TM_VDLLEXT and TM_VPERIEXT are activated.

A detailed circuit configuration of the respective parts of the test device will be described below.

The error information providing unit 300 includes a first NMOS transistor NM1 having a gate receiving the error flag MAL_FL and a drain-source path between the output pad PAD_CR and a ground (VSS) terminal.

The selector 220 of the normal test unit 200 includes a plurality of output controlling units ND1, NR1, ND2 and ND3, and a plurality of switching elements PM1, NM2, PM2 and PM3. The plurality of output controlling units ND1, NR1, ND2 and ND3 receive one of the test signals TM_VPPEXT, TM_VCPEXTB, TM_VDLLEXT and TM_VPERIEXT and one of the error flags MAL_FL and MAL_FLB to output a plurality of output control signals. The plurality of switching elements PM1, NM2, PM2 and PM3 transfer the corresponding internal voltages VPP, VCP, VDLL and VPERI through the output pad PAD_CR in response to the corresponding output control signals.

In detail, the selector 220 includes a first NAND gate ND1 receiving the test signal TM_VPPEXT and the error flag MAL_FLB, a first PMOS transistor PM1 having a gate receiving an output signal of the first NAND gate ND1 and a source-drain path between an internal voltage (VPP) terminal and the output pad PAD_CR, a first NOR gate NR1 receiving the test signal TM_VCPEXTB and the error flag MAL_FL, a second NMOS transistor NM2 having a gate receiving an output signal of the first NOR gate NR1 and a drain-source path between an internal voltage (VCP) terminal and the output terminal PAD_CR, a second NAND gate ND2 having the test signal TM_VDLLEXT and the error flag MAL_FLB, a second PMOS transistor PM2 having a gate receiving an output signal of the second NAND gate ND2 and a source-drain path between an internal voltage (VDLL) terminal and the output pad PAD_CR, a third NAND gate ND3 receiving the test signal TM_VPERIEXT and the error flag MAL_FLB, and a third PMOS transistor PM3 having a gate receiving an output signal of the third NAND gate ND3 and a source-drain path between an internal voltage (VPERI) terminal and the output pad PAD_CR.

The default selector 240 includes an output control unit 242 and a transfer unit 244. The output control unit 242 detects the deactivation of the error flag MAL_FLB and the deactivation of all the test signals TM_VPPEXT, TM_VCPEXT, TM_VDLLEXT and TM_VPERIEXT. The transfer unit 244 transfers the core voltage VCORE through the output pad PAD_CR in response to an output signal of the output control unit 242. Specifically, the output control unit 242 includes a second NOR gate ND2 receiving the test signals TM_VPPEXT and TM_VPERIEXT, a third NOR gate NR3 receiving the test signals TM_VDLLEXT and TM_VCPEXT, and a fourth NAND gate ND4 receiving output signals of the second and third NOR gates NR2 and NR3 and the error flag MAL_FLB to output the output control signal. The transfer unit 244 includes a transfer gate TG1 for transferring the core voltage VCORE through the output pad PAD_CR when the output control signal is activated to a logic low level.

Figure 4:
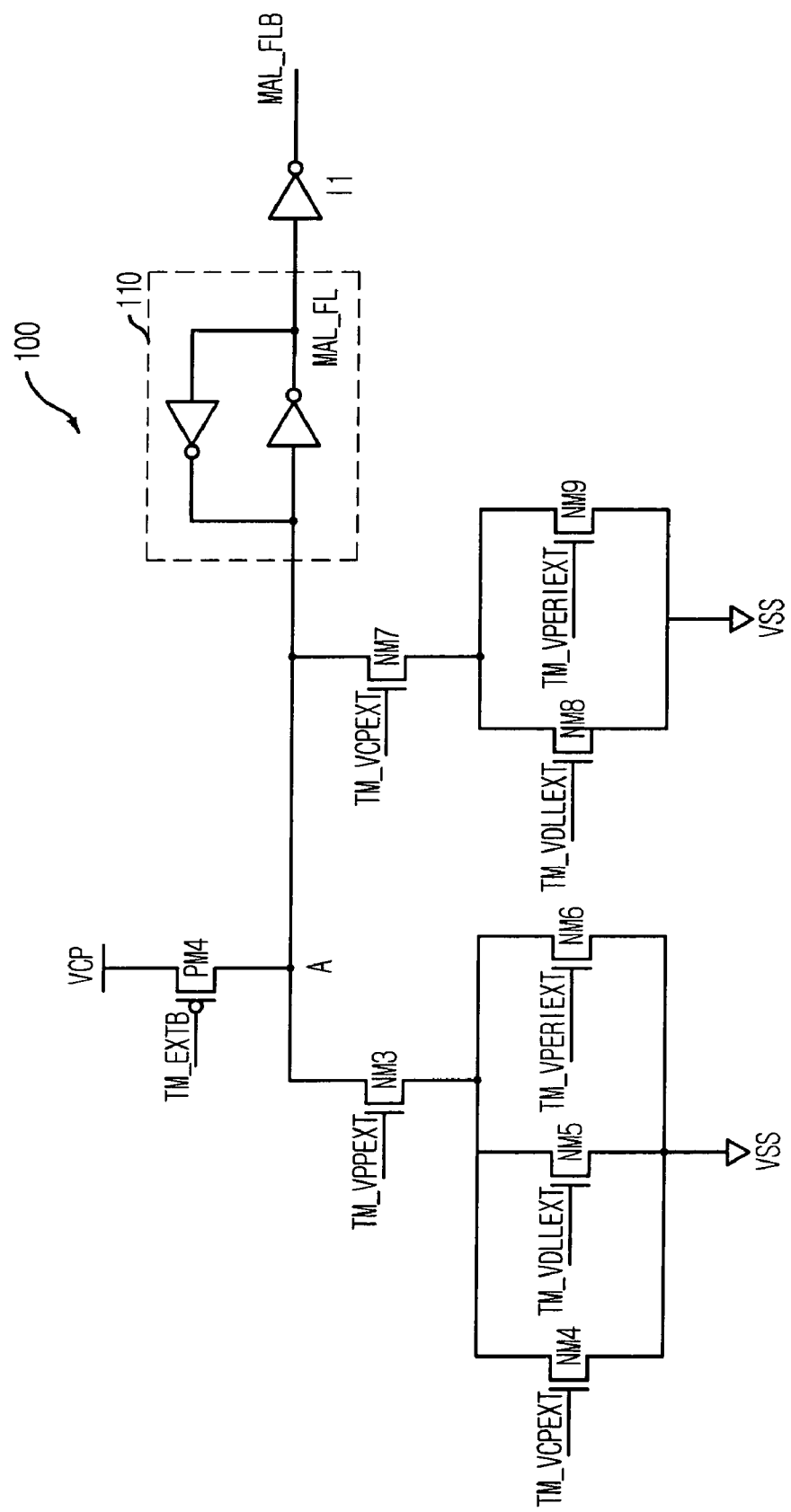
FIG. 4 is a circuit diagram of an error detecting unit of FIG. 3.

FIG. 4 is a circuit diagram of the error detecting unit 100 as shown FIG. 3.

Referring to FIG. 4, the error detecting unit 100 includes a first PMOS transistor PM4 having a gate receiving a test mode exit signal TM_EXTB and a source-drain path between the internal voltage (VCP) terminal and a node A, a first NMOS transistor NM3 having a gate receiving the test signal TM_VPPEXT and a drain connected to the node A, second to fourth NMOS transistors NM4, NM5 and NM6 connected in parallel to respectively have gates receiving the test signals TM_VCPEXT, TM_VDLLEXT and TM_VPERIEXT and drain-source paths between a source of the first NMOS transistor NM3 and the ground (VSS) terminal, a fifth NMOS transistor NM7 having a gate receiving the test signal TM_VCPEXT and a drain connected to the node A, sixth and seventh NMOS transistors NM8 and NM9 connected in parallel to respectively have gates receiving the test signals TM_VDLLEXT and TM_VPERIEXT and drain-source paths between a source of the NMOS transistor NM7 and the ground (VSS) terminal, a latch unit 110 for latching a voltage applied on the node A to output the error flag MAL_FL, and an inverter I1 for inverting an output signal of the latch unit 110 to output the error flag MAL_FLB.

Hereinafter, an operation of the error detecting unit 100 will be described.

In case where error occurs due to the concurrent activation of two or more of the test signals TM_VPPEXT, TM_VCPEXT, TM_VDLLEXT and TM_VPERIEXT, the error detecting unit 100 activates the error flag MAL_FL to a logic high level. At this point, the inversion signal MAL_FLB of the error flag MAL_FL is activated to a logic low level.

In case where no error occurs because none or one of the test signals TM_VPPEXT, TM_VCPEXT, TM_VDLLEXT and TM_VPERIEXT is activated, the error detecting unit 100 deactivates the error flag MAL_FL to a logic low level and the error flag MAL_FLB to a logic high level.

When the test exit signal TM_EXTB is activated to a logic low level, the error detecting unit 100 deactivates the error flag MAL_FL to a logic low level and the error flag MAL_FLB to a logic high level, without detecting the occurrence of the error of the test signals.

An operation of the test device illustrated in FIGS. 3 and 4 will be described below.

During a normal operation of the test mode, none or one of the test signals TM_VPPEXT, TM_VCPEXT, TM_VDLLEXT and TM_VPERIEXT is activated. At this point, the error detecting unit 100 deactivates the error flag MAL_FL to a logic low level and the error flag MAL_FLB to a logic high level. Therefore, the normal test unit 200 outputs the corresponding internal voltage through the output pad PAD_CR in response to the inputted test signal. For example, when the test signal TM_VPPEXT is activated to a logic high level, the internal voltage VPP is outputted through the output pad PAD_CR. Also, when all the test signals TM_VPPEXT, TM_VCPEXT, TM_VDLLEXT and TM_VPERIEXT are deactivated, the default selector 240 of the normal test unit 200 is activated to output the core voltage VCORE as a default through the output pad PAD_CR.

Meanwhile, when two or more of the test signals TM_VPPEXT, TM_VCPEXT, TM_VDLLEXT and TM_VPERIEXT are activated, the error occurs in the test mode. At this point, the error detecting unit 100 activates the error flag MAL_FL to a logic high level and the error flag MAL_FLB to a logic low level. Therefore, the normal test unit 200 is turned off in response to the error flags MAL_FL and MAL_FLB and the error information providing unit 300 outputs the ground voltage VSS through the output pad PAD_CR in response to the error flag MAL_FL, indicating to the external test device that the error occurs in the inputted test signals.

Accordingly, the above-described test device further includes the error detecting unit for detecting the case where two or more of the test signals are applied, and controls the test operation according to the error flags outputted from the error detecting unit. Consequently, when the error occurs in the test signals, the occurrence of the error is indicated to the external device, thereby improving the test reliability.

The present application contains subject matter related to Korean patent application Nos. 2005-90941 & 2005-123981, filed in the Korean Intellectual Property Office on Sep. 29, 2005 & Dec. 15, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A test device, comprising:
an error detecting unit for detecting an error of test signals and generating an error flag;
a normal test unit for performing a test operation according to the test signals when the error flag is deactivated; and
an error information providing unit for indicating the error of the test signals when the error flag is activated.

2. The test device as recited in claim 1, wherein the error detecting unit activates the error flag when two or more of the test signals are concurrently activated, and deactivates the error flag when a test exit signal is input.

3. The test device as recited in claim 2, wherein the error detecting unit includes:
a first PMOS transistor having a gate receiving the test exit signal and a source-drain path between an internal voltage supply terminal and a first node;
a first NMOS transistor having a gate receiving a first test signal and a drain connected to the first node;
second to fourth NMOS transistors connected in parallel to respectively have gates receiving second to fourth test signals and drain-source paths between a source of the first NMOS transistor and a reference voltage terminal;
a fifth NMOS transistor having a gate receiving the second test signal and a drain connected to the first node;
sixth and seventh NMOS transistors connected in parallel to respectively have gates receiving the third and fourth test signals and drain-source paths between a source of the fifth NMOS transistor and the ground terminal;
a latch unit for latching a voltage applied on the first node and outputting the error flag; and
an inverter for inverting an output signal of the latch unit and outputting an inverted error flag.

4. A test device, comprising:
an error detecting unit for detecting an error of test signals and generating an error flag;
a normal test unit for outputting a corresponding one of internal voltages through an output pad in response to the test signals when the error flag is deactivated; and
an error information providing unit for indicating that the error occurs in the test signals when the error flag is activated.

5. The test device as recited in claim 4, wherein the error detecting unit activates the error flag when two or more of the test signals are concurrently activated, and deactivates the error flag when a test exit signal is input.

6. The test device as recited in claim 5, wherein the error detecting unit includes:
a PMOS transistor having a gate receiving the test exit signal and a source-drain path between an internal voltage supply terminal and a first node;
a first NMOS transistor having a gate receiving a first test signal and a drain connected to the first node;
second to fourth NMOS transistors connected in parallel to respectively have gates receiving second to fourth test signals and drain-source paths between a source of the first NMOS transistor and a ground terminal;
a fifth NMOS transistor having a gate receiving the second test signal and a drain connected to the first node;
sixth and seventh NMOS transistors connected in parallel to respectively have gates receiving the third and fourth test signals and drain-source paths between a source of the fifth NMOS transistor and the ground terminal;
a latch unit for latching a voltage applied on the first node and outputting the error flag; and
an inverter for inverting an output signal of the latch unit and outputting an inverted error flag.

7. The test device as recited in claim 5, wherein the normal test unit includes:
a selector for outputting a corresponding one of internal voltages through the output pad in response to the test signals when the error flag is deactivated; and
a default selector for detecting the deactivation of the test signals when the error flag is deactivated, and outputting a default voltage through the output pad.

8. The test device as recited in claim 7, wherein the selector includes:
output controlling units for receiving the test signals and the error flag to output a plurality of output control signals; and
switching elements for transferring the corresponding one of internal voltages through the output pad in response to the output control signals.

9. The test device as recited in claim 8, wherein the output controlling units include NAND gates and NOR gates, each for receiving a corresponding one of the test signals and the error flag to output a corresponding one of the output control signals.

10. The test device as recited in claim 8, wherein the switching elements include a plurality of MOS transistors, each having a gate coupled to a corresponding one of the output control signals and a drain-source path connected between a respective internal voltage supply terminal and the output pad.

11. The test device as recited in claim 8, wherein the output controlling units include:
a first NAND gate receiving a first test signal and an inverted error flag;
a NOR gate receiving a second test signal and the error flag;
a second NAND gate receiving a third test signal and the inverted error flag; and
a third NAND gate receiving a fourth test signal and the inverted error flag.

12. The test device as recited in claim 11, wherein the switching elements include:
a first PMOS transistor having a gate receiving an output signal of the first NAND gate and a source-drain path between a first internal voltage supply terminal and the output pad;
a first NMOS transistor having a gate receiving an output signal of the NOR gate and a source-drain path between a second internal voltage supply terminal and the output pad;
a second PMOS transistor having a gate receiving an output signal of the second NAND gate and a source-drain path between a third internal voltage supply terminal and the output pad; and
a third PMOS transistor having a gate receiving an output signal of the third NAND gate and a source-drain path between a fourth internal voltage supply terminal and the output pad.

13. The test device as recited in claim 12, wherein the error detecting unit includes:
a fourth PMOS transistor having a gate receiving the test exit signal and a source-drain path between a fifth internal voltage terminal and a first node;
a second NMOS transistor having a gate receiving the first test signal and a drain connected to the first node;
third to fifth NMOS transistors connected in parallel to respectively have gates receiving the second to fourth test signals and drain-source paths between a source of the second NMOS transistor and the ground terminal;
a sixth NMOS transistor having a gate receiving the second test signal and a drain connected to the first node;
seventh and eighth NMOS transistors connected in parallel to respectively have gates receiving the third and fourth test signals and drain-source paths between a source of the sixth NMOS transistor and the ground terminal;
a latch unit for latching a voltage applied on the first node and outputting the error flag; and
an inverter for inverting an output signal of the latch unit and outputting the inverted error flag.

14. The test device as recited in claim 7, wherein the default selector includes:
a default output control unit for detecting the deactivation of the error flag and the deactivation of all the test signals; and
a transfer unit for transferring the default voltage through the output pad in response to an output signal of the default output control.

15. The test device as recited in claim 14, wherein the default output control unit includes:
a first NOR gate receiving first and second test signals;
a second NOR gate receiving third and fourth test signals; and
a first NAND gate receiving output signals of the first and second NOR gates and the error flag to output a default output control signal.

16. The test device as recited in claim 15, wherein the transfer unit is a transfer gate for transferring the default voltage through the output pad when the default output control signal is activated to a logic low level.

17. The test device as recited in claim 16, wherein the error detecting unit includes:
a PMOS transistor having a gate receiving the test exit signal and a source-drain path between an internal voltage supply terminal and a first node;
a first NMOS transistor having a gate receiving a first test signal and a drain connected to the first node;
second to fourth NMOS transistors connected in parallel to respectively have gates receiving second to fourth test signals and drain-source paths between a source of the first NMOS transistor and a ground terminal;
a fifth NMOS transistor having a gate receiving the second test signal and a drain connected to the first node;
sixth and seventh NMOS transistors connected in parallel to respectively have gates receiving the third and fourth test signals and drain-source paths between a source of the fifth NMOS transistor and the ground terminal;
a latch unit for latching a voltage applied on the first node and outputting the error flag; and
an inverter for inverting an output signal of the latch unit and outputting an inverted error flag.

18. The test device as recited in claim 4, wherein the error information providing unit outputs a ground voltage through the output pad when the error flag is activated.

19. The test device as recited in claim 18, wherein the error information providing unit includes a first NMOS transistor having a gate receiving the error flag and a drain-source path between the output pad and a ground terminal.

20. The test device as recited in claim 19, wherein the error detecting unit includes:

a PMOS transistor having a gate receiving the test exit signal and a source-drain path between an internal voltage supply terminal and a first node;

a second NMOS transistor having a gate receiving a first test signal and a drain connected to the first node;

third to fifth NMOS transistors connected in parallel to respectively have gates receiving second to fourth test signals and drain-source paths between a source of the seventh NMOS transistor and a ground terminal;

a sixth NMOS transistor having a gate receiving the second test signal and a drain connected to the first node;

seventh and eighth NMOS transistors connected in parallel to respectively have gates receiving the third and fourth test signals and drain-source paths between a source of the sixth NMOS transistor and the ground terminal;

a latch unit for latching a voltage applied on the first node and outputting the error flag; and an inverter for inverting an output signal of the latch unit and outputting an inverted error flag.

* * * * *